United States Patent Office 3,737,319

Patented June 5, 1973

3,737,319

PHOTOGRAPHIC ELEMENTS COMPRISING PHOTO-SENSITIVE POLYMERS

Douglas G. Borden, Rochester, N.Y., assignor to Eastman Kodak Company, Rochester, N.Y.

No Drawing. Filed Mar. 15, 1971, Ser. No. 124,602
Int. Cl. G03c *1/70*
U.S. Cl. 96—115 R 2 Claims

ABSTRACT OF THE DISCLOSURE

There are disclosed light-sensitive polymers containing recurring groups having the formula

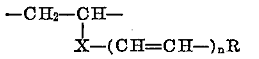

wherein X is a divalent, acyclic organic radical containing at least one ester group or amide group, *n* is a whole number from 1 to 3 and R is an unsaturated cyclic group such as an aromatic or heterocyclic radical. The preferred polymers disclosed contain recurring groups having the formula

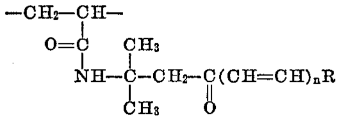

where R is an unsaturated cyclic group such as an aromatic or hetrocyclic group. Two methods of preparing such a polymer are disclosed. According to one method, an aromatic or heterocyclic aldehyde is reacted with a polymer containing diacetone acrylamide units. According to the second method, diacetone acrylamide monomer is first reacted with a heterocyclic or aromatic aldehyde to prepare a light-sensitive monomer having the formula

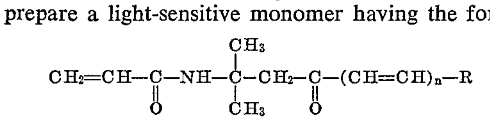

and the light-sensitive monomer is then homopolymerized or copolymerized with another vinyl monomer. The light-sensitive polymers are useful in photo-mechanical reproduction processes such as for lithographic purposes or as photoresists. The light-sensitive polymers can be spectrally and chemically sensitized. The photopolymerization of the light-sensitive monomers is also disclosed.

This invention relates to light-sensitive polymers and to the use of such polymers in photo-mechanical reproduction processes. This invention also relates to light-sensitive monomers which can be polymerized to form light-sensitive polymers.

Light-sensitive polymers prepared by the condensation of an aromatic aldehyde with a polymer having appended side chains containing an active methyl group, which chains are linked to the polymer backbone by an aromatic nucleus are known. An example of such a polymer is poly(vinylbenzalacetophenone) which contains recurring groups having the formula

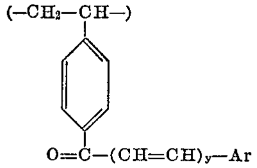

U.S. Pat. No. 2,811,510 describes polymers containing recurring groups having the formula

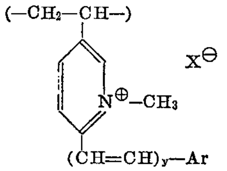

These polymers can be obtained by condensing aromatic aldehydes with polyvinyl picolinium salts. U.S. Pat. No. 2,908,667 discloses light-sensitive polymers having recurring groups of the formula

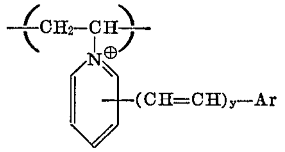

Such polymers can be obtained by the reaction of polyvinyl sulfonates with 2- or 4-picoline followed by condensation of the resulting polymers with aromatic aldehydes. In the above formulae, *y* equals 1 or 2, $X^{\ominus}$ is an anion and —Ar is an aromatic group. The light sensitivity of such polymers is manifested by insolubilization of a coating of the polymer on exposure to actinic light. By exposing the coating to a source of actinic radiation in an imagewise fashion and developing with a material which is a solvent for the unexposed area of the coating and a nonsolvent for the exposed areas of the coating a relief image is obtained. These are of value in various types of photomechanical reproduction processes.

In the polymers described above, the aromatic ring is attached directly by a chemical bond to a carbon atom in the polymer backbone. While these polymers have excellent light sensitivity, their methods of preparation involve reactions which must be carefully controlled. For example, in the reaction of polyvinyl picolinium salts with aromatic aldehydes, conditions must be such that Michael addition does not occur. Furthermore, images of light-sensitive polymers are sometimes not sufficiently oleophilic for lithographic use.

It is an object of this invention to provide new light-sensitive polymers.

It is a further object of this invention to provide new light-sensitive polymers which can be spectrally and chemically sensitized.

It is still another object of this invention to provide light-sensitive polymers in which the light-sensitive chromophore is separated from the polymer backbone by means of an acyclic organic group.

It is another object of this invention to provide light-sensitive monomers and processes for polymerizing them to prepare light-sensitive polymers.

It is yet another object of this invention to provide novel photosensitive elements.

These and other objects are attained by the practice of this invention which, briefly, comprises providing a light-sensitive vinyl monomer or polymer containing the group —X—(CH=CH—)$_n$R wherein X is a divalent, acyclic organic radical containing at least one carboxy group

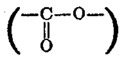

or amido group

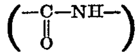

*n* is a whole number of from 1 or 2 and R is an unsaturated cyclic group such as an aromatic or heterocyclic radical, for example, phenyl, naphthyl, anthranyl, furyl, thienyl, and the like, said radical being optionally substituted at one or more available positions with groups such as alkyl of 1–10 carbon atoms, alkoxy of 1–10 carbon atoms, hydroxy, nitro, di(lower) alkylamino, azido, halogen, cyano, diarylamino, and the like. The radical X is preferably joined to the group (—CH=CH—)$_n$R through a carbonyl group

The light-sensitive vinyl monomers of this invention have the formula $CH_2$=CH—X—(CH=CH—)$_n$R and the light-sensitive polymers contain recurring groups having the formula

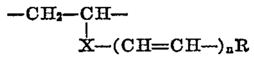

wherein X, *n* and R have the meanings, previously described.

The light-sensitive monomers and polymers of this invention can be prepared by reacting an aromatic aldehyde, such as benzaldehyde, anisaldehyde, p-azidobenzaldehyde, p-dimethylaminobenzaldehyde and cinnamaldehyde or a heterocyclic aldehyde such as 2-furaldehyde with a monomer or a polymer having appended thereto an acyclic radical containing at least one carboxy group or amido group and containing an active methyl or methylene group. The methyl or methylene group is preferably adjacent to a carbonyl group. The reaction can be carried out in a polar solvent such as an alkanol, e.g. methanol or ethanol, or in a mixture of such an alkanol and water or at reflux in the presence of a catalyst, such as potassium hydroxide, hydrochloric acid, or trifluoroboron etherate, for a period of time sufficient to allow the reaction to proceed substantially to completion. Reaction times of several minutes to several hours are generally sufficient. The resultant monomer can be purified by precipitation in a 5% hydrochloric acid solution, extraction with bisulfite to remove any unreacted aldehyde, if desired, followed by a water wash, redissolving in a suitable solvent and reprecipitation.

The acyclic radical can be present as a recurring unit in a nonlight-sensitive polymer in which case the light-sensitive polymer is prepared by reacting the nonlight-sensitive polymer with an aromatic or heterocyclic aldehyde as described above. Alternatively, the radical can be present on a vinyl monomer and this monomer reacted with an aromatic or heterocyclic aldehyde to prepare a light-sensitive monomer. In the latter case, the light-sensitive monomer is then polymerized to prepare a light-sensitive polymer. An example of such an acyclic radical is one having the structural formula

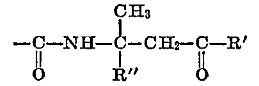

wherein R′ and R″ each may be an alkyl group of from 1 to 3 carbon atoms.

Other suitable divalent radicals have structural formulae such as:

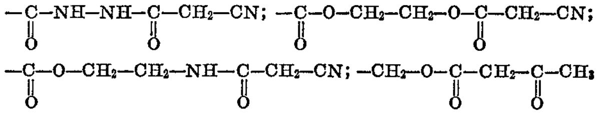

and

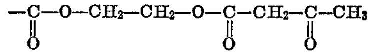

The preferred light-sensitive polymers of this invention contain recurring groups having the formula

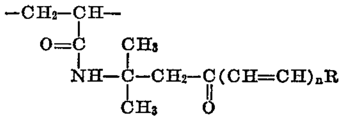

The polymers can be prepared by reacting an aromatic or heterocyclic aldehyde with a polymer containing recurring diacetone acrylamide units. Alternatively, diacetone acrylamide monomer can first be reacted with a heterocyclic or aromatic aldehyde to prepare a light-sensitive monomer. Such reaction is represented by the following equation.

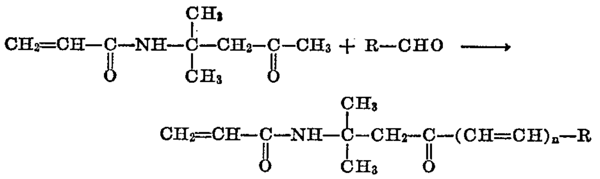

In the above formulas, *n* and R have the meanings previously described.

To prepare the preferred light-sensitive polymer the light-sensitive monomer can be homopolymerized or copolymerized with other monomers using vinyl polymerization techniques well known in the art—e.g., emulsion polymerization, solution polymerization or bulk polymerization. It may also be photopolymerized and this photopolymerization may be sensitized.

Due to the high degree of light-sensitivity of the light-sensitive monomers, relatively high proportions of non-light sensitive monomers can be incorporated into the light-sensitive polymer to improve other properties such as solubility, glass transition temperature, melting point, resistance to etching solutions, press performance and the like. Vinyl monomers can be copolymerized with diacetone acraylamide or the light-sensitive monomer derived therefrom such as the acrylates, methacrylates, styrenes, vinyl chloride, vinylidene chloride, acrylonitrile, etc. Diene monomers such as butadiene can also be used. Vinyl polymerization catalysts do not cause crosslinking of the group —(CH=CH)$_n$R since they cause polymerization only through the terminal vinyl group.

The condensation of the aromatic or heterocyclic aldehyde with diacetone acrylamide or a polymer thereof may be accomplished under conditions well known in the art such as described above. Certain aldehyde, such as benzaldehyde, p - chlorobenzaldehyde, p - nitrobenzaldehyde, cinnamaldehyde and 2-furaldehyde are preferably condensed with a basic catalyst such as alcoholic potassium hydroxide. Acidic catalysts, such as hydrochloric acid, boron fluoride etherate or sulfuric acid are preferred with certain aldehydes such as p-dimethylaminobenzaldehyde and anisaldehyde.

The speed and spectral response of the light-sensitive polymers of this invention can be controlled by varying the ratio of light-sensitive to nonlight-sensitive monomer in the polymer, by using different aldehydes in the preparation of the light-sensitive monomer or polymer, by varying the nonlight-sensitive monomer used, by the addition of known sensitizers or by a combination of these procedures. It is a significant advantage that the light-sensitive polymers of this invention can be spectrally and chemically sensitized since many of the light-sensitive polymers of this type heretofore known, such as C-vinyl and N-vinyl styrylpyridinium polymers and poly(vinylbenzalacetophenone) do not respond to such sensitization.

The polymers of this invention are inherently highly light-sensitive in the ultraviolet and near visible region of the spectrum. When the light-sensitive group is derived by the reaction of cinnamaldehyde or a derivative thereof, the group contains conjugated unsaturation—i.e., —CH=CH—CH=CH—. This increases the light-sensitivity of the polymer and extends the absorption maximum farther into the visible portion of the spectrum.

Photosensitive elements can be prepared from the polymers of this invention by coating solutions containing from 1 to 10% by weight of the polymer onto a suitable substrate such as aluminum, copper, zinc, or suitably subcoated paper, polyester or acetate sheets. The coated sheets are then imagewise exposed to a suitable source of actinic radiation to insolubilize the polymer coating in exposed areas and an image is developed by removing the polymer from unexposed areas, typically by washing with a solvent therefor. The polymers of this invention may generally be used in any of the photographic processes which require the formation of a relief or resist image. Since the light-sensitive monomers of this invention are photopolymerizable, photosensitive elements can also be prepared by coating these monomers on plates.

The following examples further illustrate this invention. Examples 1 to 9 show the preparation of light-sensitive monomers by the condensation of diacetone acrylamide with aromatic aldehydes; Examples 10 and 17 show the preparation of light-sensitive polymers in accordance with this invention; and Example 18 illustrates the photopolymerization of a light-sensitive monomer.

EXAMPLES 1 TO 4

Diacetone acrylamide is condensed with each of the aldehydes set forth in Table 1 by heating the reactants in methanol and water at the reflux temperature of methanol. Potassium hydroxide is used as the condensation catalyst. The products are purified and recovered from the reaction medium by precipitation and filtration. The products have the formula

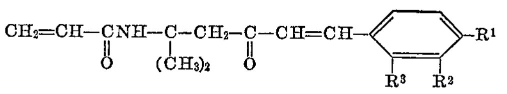

wherein $R^1$, $R^2$ and $R^3$ are as described in Table 1. This table also shows the manner of purification and recovery as well as melting point, color and $\lambda_{max}$ in methanol of the products.

TABLE 1

| Example | Reactant aldehyde | Moles | Diacetone acrylamide (moles) | $R^1$ | $R^2$ | $R^3$ | Solvent volume $MeOH/H_2O$ | Catalyst | Reaction time, hrs. | Precipitated in— | Extracted with bisulfite and washed with water | Redissolved in— | Reprecipitated in— | M.P., °C. | Color | $\lambda_{max}$ (mμ) |
|---|---|---|---|---|---|---|---|---|---|---|---|---|---|---|---|---|
| 1 | Benzaldehyde | 0.20 | 0.20 | —H | —H | —H | 125 ml./100 ml. | 0.20 M KOH | [1] 20 | HCl plus $H_2O$ | Yes | Benzene | Ligroin | 67 | Off-white | 303 |
| 2 | p-Chlorobenzaldehyde | 0.50 | 0.50 | —Cl | —H | —H | 600 ml./50 ml. | 0.50 M KOH | 5 | do | No | Acetone | Water | 95 | Yellow | 298 |
| 3 | p-Nitrobenzaldehyde | 0.21 | 0.50 | $—NO_2$ | —H | —H | 700 ml./20 ml. | 0.21 M KOH | 3 | do | No | Benzene/acetone | Ligroin | 160 | Red | 344 |
| 4 | 1-naphthaldehyde | 0.50 | 0.50 | —H | $—C_4H_4—$ | | 700 ml./40 ml. | 0.50 M KOH | 7 | do | Yes | Dimethylformamide | do | 66 | Yellow | 333 |

[1] Minutes.

EXAMPLE 5

The process of Examples 1 to 4 is repeated using cinnamaldehyde as the aldehyde reactant. The light-sensitive monomer which is recovered as the formula

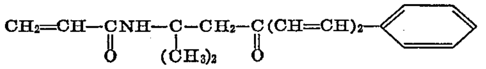

The product has a melting point of 80 to 85° C., is light yellow in color and has a $\lambda_{max}$ in methanol of 377 mμ.

EXAMPLE 6

The process of Examples 1 to 4 is repeated using terephthaldehyde as the reactant aldehyde. The resultant product has the formula

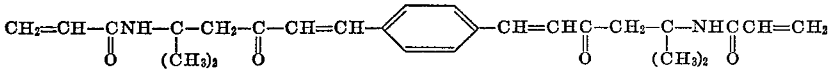

The product is white, has a melting point of 208 to 210° C. and a $\lambda_{max}$ in methanol of 338 mμ.

EXAMPLES 7 TO 9

The process of Examples 1 to 4 is repeated substituting hydrochloric acid for the potassium hydroxide as a condensation catalyst. No water is used in the reaction medium. The products which are purified and recovered in a manner similar to that of Examples 1 to 4, have the formula

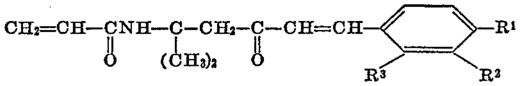

wherein $R^1$, $R^2$ and $R^3$ are as described in Table 2. This table also sets forth the reactant aldehyde used to prepare the product and the melting point, color and $\lambda_{max}$ in methanol of the products.

TABLE 2

| Example | Reactant aldehyde | $R^1$ | $R^2$ | $R^3$ | M.P., ° C. | Color | $\lambda_{max}$ (mμ) |
|---|---|---|---|---|---|---|---|
| 7 | Anisaldehyde | $-OCH_3$ | —H | —H | 95 | Yellow | 328 |
| 8 | p-Dimethylaminobenzaldehyde | $-N(CH_3)_2$ | —H | —H | 64-65 | Red | 340, 343 |
| 9 | Vanillin | —OH | $-OCH_3$ | —H | 128-130 | Yellow | 36 |

EXAMPLE 10

Poly(diacetone acrylamide), having an inherent viscosity of 2.19 measured in dimethylformamide (4.0 g.; 0.023 mole) is dissolved in 75 ml. of anisaldehyde by stirring at 80° C. for one hour. A solution of 5 ml. of 10% sulfuric acid in 4.5 ml. acetic acid, diluted with 10 ml. of anisaldehyde, is added and the reaction mixture is heated at 75° C. without stirring for 7 hours. The reaction mixture is poured as a fine stream into diethyl ether resulting in the precipitation of poly(anisaldiacetone acrylamide). The precipitated polymer is slurried four times in ether after which it is collected by filtration and dried. The product is then redissolved in dimethylformamide, reprecipitated in water, washed, filtered and dried. The polymer is yellow and has a $\lambda_{max}$ at 325 mμ in methanol. It is coated on grained aluminum plates from a 5% solution in methanol. The plates are exposed through a photographic line and half-tone negative to a medium pressure mercury source. The exposed elements are then developed in methanol. The elements readily accept dye or lithographic ink in the exposed and insolubilized image areas. Photographic speed is measured by the procedure described in Minsk et al. J. Appl. Pol. Sci., vol. II, No. 6, pp. 302–309 (1959), and is expressed in terms of sensitivity value which is a measure of the relative speed of the coating compared with an unsensitized coating of polyvinyl cinnamate which has a sensitivity value of 2.2. The unsensitized coating has a sensitivity value of 400 and a spectral range of 270–410 mμ. The spectral range was extended to 450 mμ by addition to the coating of 1 part of 2-benzoylmethylene-1-methyl-β-naphthothiazoline per 10 parts of polymer; to 460 mμ by the addition to the coating of 1 part of methyl 3-methyl-2-benzothiazolinylidene dithioacetate per 10 parts of polymer; and to 470 mμ by the addition to the coating of 1 part of 4H-quinolizine-4-thione per 10 parts of polymer.

EXAMPLE 11

A solution of poly(diacetone acrylamide) having an inherent viscosity of 1.01 in dimethylformamide (2.0 g.; 0.012 mole) in 50 ml. of 2-furaldehyde is mixed with a solution of 2.0 g. of potassium hydroxide in 20 ml. of ethyl alcohol and 1 ml. of water. This solution is held at 50–52° C. without stirring for 21 hours and is then poured into water containing sufficient acid to neutralize the base, with stirring. Poly(furaldiacetone acrylamide) precipitates and is recovered, redissolved in acetone and reprecipitated in water. After filtering and drying, the product is coated on grained aluminum plates from a 3% solution in 2-butanone. An excellent negative working lithographic image is obtained with exposure to a medium pressure mercury lamp of 5 seconds. The $\lambda_{max}$ of the polymer is 319 mμ in methanol.

EXAMPLE 12

Nine grams of a copolymer comprising 50% by weight of styrene units and 50% by weight of diacetone acrylamide units having an inherent viscosity of 0.43 is dissolved in 90 ml. of 2-ethoxyethanol. To this solution is added trans-cinnamaldehyde (3.52 g.; 0.267 mole). A solution of 1.0 g. of potassium hydroxide in 110 ml. of 2-ethoxyethanol containing a trace of water and ethanol is added. The mixture is stirred at room temperature and then allowed to stand without heating or stirring. Samples are withdrawn at 30 minutes, 50 minutes, 80 minutes and 150 minutes and neutralized with diluted HCl in 2-ethoxyethanol. The samples withdrawn at 30 minutes and 50 minutes are precipitated in ether, dried, redissolved in acetone and dimethylformamide, reprecipitated in water and re-dried. Each of the samples of cinnamaldiacetone acrylamide-styrene copolymer thus obtained shows excellent light sensitivity. The sample withdrawn at 50 minutes has an absorption peak at 325 mμ, characteristic of cinnamaldiacetone acrylamide. An unsensitized coating has a sensitivity value of 1,000 and a coating sensitized with a 2,6-di(p-ethoxyphenyl) - 4 - (p-n-amyloxyphenyl) thiapyrylium perchlorate has a sensitivity value of 10,000. The respective spectrograms for the unsensitized coating is 290–400 mμ and for the sensitized coating is 280–580 mμ.

The samples withdrawn at 80 and 150 minutes are precipitated in water, leached in ether and dried. Both samples are soluble in dimethylformamide. The photographic results show that reaction times greater than 50 minutes are not necessary to obtain a high speed photopolymer.

EXAMPLE 13

The process of Example 12 is repeated except that an equivalent amount of p-azidobenzaldehyde is used instead of cinnamaldehyde. Samples are withdrawn after reaction times of 10 minutes, 25 minutes, 40 minutes, 60 minutes and 100 minutes. Gelation occurs at 85 minutes. The sample withdrawn at 40 minutes has a sensitivity value equivalent to the product in Example 12 withdrawn at 50 minutes. This sample has a spectral absorption from 260–430 mμ.

EXAMPLE 14

A one-liter, three-necked flask containing 500 ml. of distilled water is flushed with nitrogen for 2 hours at room temperature and is then heated to 60° C. Two grams of sodium lauryl sulfate are added. Benzaldiacetone acrylamide (50 g.; 0.195 mole) dissolved in monomer grade styrene (50 g.; 0.480 mole) is added with stirring. Potassium persulfate (1.0 g.) and sodium bisulfite (0.33 g.) are then added and stirring is continued at 60° C. under a nitrogen atmosphere. After 40 minutes, there is evidence that the emulsion is beginning to break. After 60 minutes, the reaction is terminated by pouring the reaction mixture into 4 liters of water containing 5% HCl to break the emulsion. The resultant copolymer of styrene and benzaldiacetone acrylamide is recovered by filtration washed in water and dried. It is redissolved in acetone and reprecipitated into water. The pale yellow polymer is dissolved in 2-butanone and coated on a grained aluminum plate. A negative-working lithographic image is produced after exposure, solvent development and inking.

EXAMPLE 15

In a 300 ml. three-necked round bottom flasfl fitted with a stirrer, a reflux condenser and a gas dispersion tube there are placed 200 ml. of p-dioxane. Nitrogen is bubbled through the dioxane for ½ hour and n-butyl acrylate (25 g.; 0.195 mole) and benzaldiacetone acrylamide (25 g.; 0.148 mole) are added. The mixture is stirred at 50° C. and flushed with nitrogen. Azobisisobutyronitrile (0.25 g.) is then added and the clear solution is allowed to stand at 50° C. for three days. The solvent is removed under vacuum and the reside is dissolved in acetone and precipitated in water. The light yellow polymer produces a lithographic image when coated and exposed as described in Example 14.

EXAMPLE 16

Anisaldiacetone acrylamide (10 g.; 0.035 mole) is dissolved in styrene (10 g.; 0.096 mole) and 0.1 g. of azobisisobutyronitrile is added as a catalyst. The reaction is run in a sealed tube at 60° C. for 64 hours. The resultant light-sensitive copolymer is dissolved in dimethylformamide and precipitated into methanol.

EXAMPLE 17

The process of Example 16 is repeated using p-chlorobenzaldiacetone acrylamide (10 g.; 0.034 mole) and methyl methacrylate (10 g.; 0.100 mole) as the polymerizable monomers. The polymerization is run at 60° C. for 40 hours. The resultant light-sensitive polymer is dissolved in dimethylformamide and precipitated in methanol.

EXAMPLE 18

A sample of the product of Example 6 is recrystallized from acetone. The product is whirl-coated on a grained aluminum plate as a 5% solution in dimethyl formamide. A similar coating containing 0.3% by weight of 2,6-bis(p-ethoxyphenyl) - 4 - (p - n - amyloxyphenyl)thiapyrylium perchlorate as a sensitizer is made. Both coatings produce negative-working lithographic images when exposed imagewise to a medium-pressure mercury lamp followed by development in acetone or with benzyl alcohol and then treating it with a desensitizing etch and a lithographic ink. The sensitizer increases both the speed and the spectral response of the coating.

The invention has been described in detail with particular reference to preferred embodiments thereof, but it will be understood that variations and modifications may be effected within the spirit and scope of the invention.

I claim:

1. A photosensitive element comprising a support having thereon a layer comprised of a light-sensitive polymer containing recurring groups having the formula

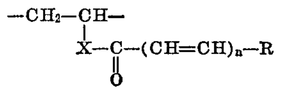

wherein X is a divalent, acyclic organic radical containing at least one amide group, *n* is a whole number from 1 to 2 and R is an aromatic, furyl or thienyl group.

2. A photosensitive element comprising a support having thereon a layer comprised of a light-sensitive polymer containing recurring groups having the formula

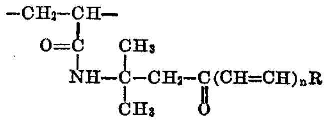

wherein R is an aromatic, furyl or thienyl group and *n* is 1 or 2.

References Cited

UNITED STATES PATENTS

| | | | |
|---|---|---|---|
| 2,835,656 | 5/1958 | Unruh et al. | 96—115 R |
| 3,357,831 | 12/1967 | Wu | 96—115 R |

RONALD H. SMITH, Primary Examiner

U.S. Cl. X.R.

96—33, 35.1, 86 P; 204—159.14